(12) United States Patent
Cortie et al.

(10) Patent No.: US 8,780,324 B2
(45) Date of Patent: Jul. 15, 2014

(54) FLUID HANDLING STRUCTURE, LITHOGRAPHIC APPARATUS AND DEVICE MANUFACTURING METHOD

(75) Inventors: Rogier Hendrikus Magdalena Cortie, Ittervoort (NL); Michel Riepen, Veldhoven (NL); Rob Cornelissen, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 504 days.

(21) Appl. No.: 13/103,479

(22) Filed: May 9, 2011

(65) Prior Publication Data
US 2011/0277859 A1    Nov. 17, 2011

Related U.S. Application Data

(60) Provisional application No. 61/333,662, filed on May 11, 2010.

(51) Int. Cl.
*G03B 27/32* (2006.01)
*G03B 27/42* (2006.01)
*G03B 27/52* (2006.01)

(52) U.S. Cl.
CPC ............................ *G03F 7/40341* (2013.01)
USPC .................................. 355/30; 355/53; 355/77

(58) Field of Classification Search
CPC ................................................. G06F 7/70341
USPC ......................................... 355/30, 53, 77
See application file for complete search history.

(56) References Cited

U.S. PATENT DOCUMENTS

| | | |
|---|---|---|
| 4,509,852 A | 4/1985 | Tabarelli et al. |
| 2004/0136494 A1 | 7/2004 | Lof et al. |
| 2004/0207824 A1 | 10/2004 | Lof et al. |
| 2006/0119809 A1 | 6/2006 | Verhagen et al. |
| 2007/0030464 A1 | 2/2007 | Kemper et al. |
| 2007/0110213 A1 | 5/2007 | Leenders et al. |
| 2007/0296939 A1 | 12/2007 | Nishii |
| 2008/0002109 A1 | 1/2008 | Hasegawa et al. |
| 2008/0002169 A1 | 1/2008 | Hasegawa et al. |
| 2008/0192214 A1 | 8/2008 | Leenders et al. |
| 2008/0212046 A1 | 9/2008 | Riepen et al. |
| 2008/0233512 A1 | 9/2008 | Nishii et al. |
| 2008/0284991 A1 | 11/2008 | Nishii |

(Continued)

FOREIGN PATENT DOCUMENTS

| | | |
|---|---|---|
| EP | 1 420 300 | 5/2004 |
| JP | 2007-053193 | 3/2007 |

(Continued)

OTHER PUBLICATIONS

Japanese Office Action mailed Jun. 18, 2013 in corresponding Japanese Patent Application No. 2011-105234.

*Primary Examiner* — Toan Ton
*Assistant Examiner* — Colin Kreutzer
(74) *Attorney, Agent, or Firm* — Pillsbury Winthrop Shaw Pittman LLP

(57) ABSTRACT

A fluid handling structure for a lithographic apparatus is disclosed. The fluid handling structure has, on an undersurface, a liquid supply opening or a plurality of liquid supply openings and a liquid extraction opening or a plurality of liquid extraction openings arranged such that, in use, liquid is provided on and removed from the undersurface of the fluid handling structure.

20 Claims, 6 Drawing Sheets

(56) References Cited

U.S. PATENT DOCUMENTS

| | | |
|---|---|---|
| 2009/0231560 A1 | 9/2009 | Poon et al. |
| 2010/0196832 A1* | 8/2010 | Nagasaka ............... 430/325 |
| 2010/0313974 A1 | 12/2010 | Riepen et al. |
| 2010/0323303 A1* | 12/2010 | Nagasaka ............... 430/325 |
| 2011/0013159 A1 | 1/2011 | Kramer et al. |
| 2011/0128516 A1* | 6/2011 | Kaneko et al. ............ 355/30 |
| 2012/0057139 A1* | 3/2012 | Tanimoto et al. .......... 355/30 |
| 2012/0069309 A1* | 3/2012 | Willems et al. ........... 355/30 |
| 2012/0120376 A1* | 5/2012 | Bessems et al. .......... 355/30 |
| 2012/0162619 A1* | 6/2012 | Sato ........................ 355/27 |
| 2013/0100425 A1* | 4/2013 | Riepen ..................... 355/30 |

FOREIGN PATENT DOCUMENTS

| | | |
|---|---|---|
| JP | 2008-041822 | 2/2008 |
| JP | 2009-021498 | 1/2009 |
| JP | 2010-177669 | 8/2010 |
| JP | 2011-086940 | 4/2011 |
| JP | 2011-086968 | 4/2011 |
| JP | 2011-159865 | 8/2011 |
| WO | 99/49504 | 9/1999 |
| WO | 2005/064405 | 7/2005 |
| WO | 2008/026593 | 3/2008 |

* cited by examiner

FLUID HANDLING STRUCTURE, LITHOGRAPHIC APPARATUS AND DEVICE MANUFACTURING METHOD

This application claims priority and benefit under 35 U.S.C. §119(e) to U.S. Provisional Patent Application No. 61/333,662, entitled "Fluid Handling Structure, Lithographic Apparatus and Device Manufacturing Method", filed on May 11, 2010. The content of that application is incorporated herein in its entirety by reference.

FIELD

The present invention relates to a fluid handling structure, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

In an immersion apparatus, immersion liquid is handled by a fluid handling system or apparatus, for example a fluid handling structure. A fluid handling system may supply immersion fluid and therefore be a fluid supply system. A fluid handling system may confine fluid and thereby be a fluid confinement system. A fluid handling system may provide a barrier to fluid and thereby be a barrier member. A fluid handling system may create or use a flow of fluid (such as gas), for example to help in handling liquid. Immersion liquid may be used as the immersion fluid. In that case, the fluid handling system may be a liquid handling system.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

Another arrangement is an all wet arrangement in which the immersion liquid is unconfined as disclosed in PCT patent application publication WO 2005/064405. In such a system, the immersion liquid is unconfined. The whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

SUMMARY

It is desirable to be able to move the substrate as fast as possible below the projection system. For this, the fluid handling system, especially for a localized area fluid handling system, should be designed to allow a high scanning speed without significant liquid loss. Some liquid is likely to be lost and left behind on the surface (e.g. substrate or substrate table) facing the fluid handling system (i.e. a facing surface). If any such liquid comes into contact with a meniscus extending between the facing surface and the fluid handling system, this may cause inclusion of a gas bubble into the liquid. If such a gas bubble finds its way into the path taken by the projection beam through the immersion liquid, this can lead to an imaging defect and is therefore undesirable.

It is desirable, for example, to provide a fluid handling system in which one or more measures are taken to reduce chance of an imaging error.

According to an aspect, there is provided a fluid handling structure for a lithographic apparatus, the fluid handling structure having, on an undersurface, a liquid supply opening or a plurality of liquid supply openings and a liquid extraction opening or a plurality of liquid extraction openings arranged such that, in use, liquid is provided on and removed from the undersurface of the fluid handling structure.

According to an aspect, there is provided a fluid handling structure for a lithographic apparatus, the fluid handling structure successively having, at a boundary from a space configured to contain immersion fluid to a region external to the fluid handling structure: a gas knife device having an elongate aperture in a first line; and a liquid supply opening or a plurality of liquid supply openings outward relative to the boundary.

According to an aspect, there is provided a fluid handling structure for a lithographic apparatus, the fluid handling structure successfully having, at a boundary from a space configured to contain immersion fluid to a region external to the fluid handling structure: a meniscus pinning feature to pin a meniscus which extends between the fluid handling structure and a facing surface which faces the fluid handling structure; and a liquid supply opening or a plurality of liquid supply openings outwardly, relative to the boundary, of the meniscus pinning feature to provide liquid to an undersurface of the fluid handling structure.

According to an aspect, there is provided a device manufacturing method, comprising: providing a fluid between a final element of a projection system and a surface facing the final element and confining the fluid to a space through which a projection beam of radiation passes using a fluid handling structure; providing liquid to an undersurface of the fluid handling structure facing the surface at a location radially outward of the space; at least partly removing a droplet of liquid from the substrate by contacting the liquid on the substrate with the liquid on the undersurface of the fluid handling structure; and extracting the liquid through an extraction opening in the fluid handling structure.

According to an aspect, there is provided a fluid handling structure for a lithographic apparatus, the fluid handling structure having, on an undersurface, a liquid supply opening or a plurality of liquid supply openings to provide liquid on the undersurface such that, in use, the liquid hangs on the undersurface with a gas gap from a surface facing the undersurface at least until contacting with a liquid droplet on the facing surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
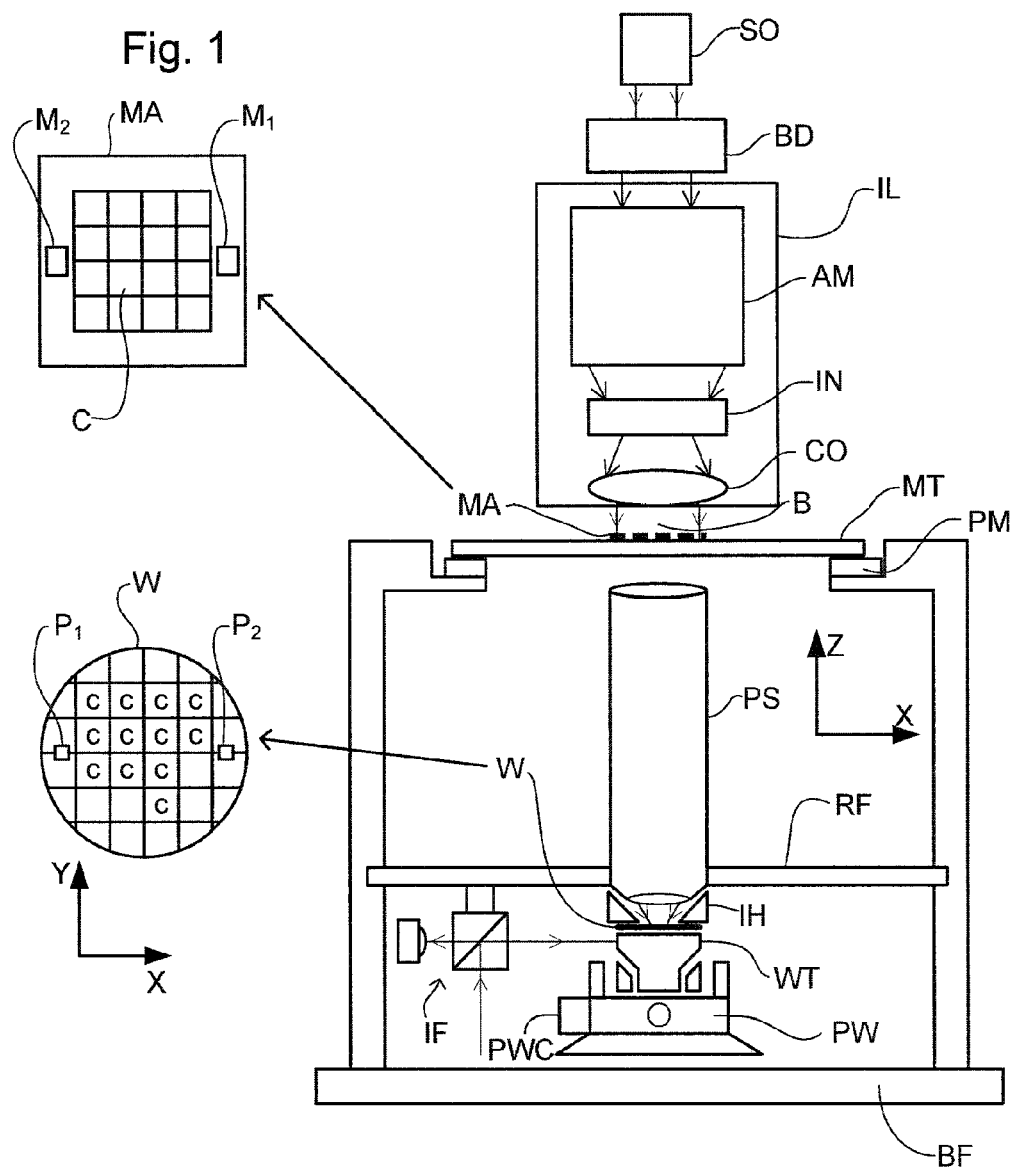
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its crosssection such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate. An area beyond a boundary of the space is not filled with liquid although may have residual liquid. The volume or space filled with liquid remains substantially stationary relative to the projection system PS while the substrate W moves underneath that area. FIGS. 2-5 show different supply devices which can be used in such a system.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 (which are described below) may be used in such a system. However, sealing features might not be present, might not be activated, might not be as efficient as normal or might otherwise be ineffective to seal liquid to only the localized area.

Figure 2:
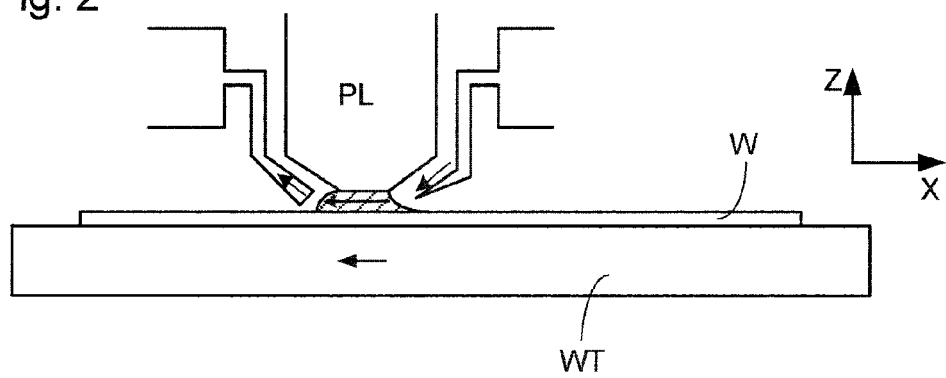
FIGS. 2 and 3 depict a liquid supply system for use in a lithographic projection apparatus.
Figure 3:
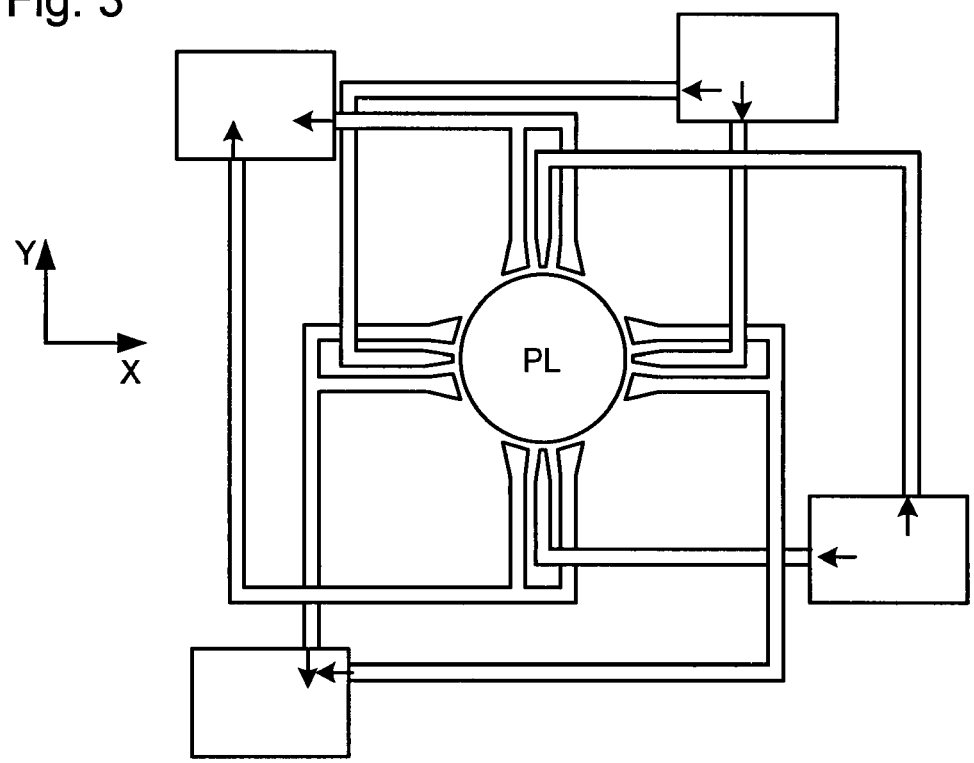

Four different types of localized liquid supply systems are illustrated in FIGS. 2-5. As illustrated in FIGS. 2 and 3, liquid is supplied by at least one inlet onto the substrate as indicated by an arrow, preferably along the direction of movement of the substrate relative to the final element. Liquid is removed by at least one outlet after having passed under the projection system as indicated by an arrow. As the substrate is scanned beneath the element in a −X direction, liquid is supplied at the +X side of the element and taken up at the −X side. FIG. 2 shows the arrangement schematically in which liquid flow is indicated by arrows; the liquid is supplied via inlet and is taken up on the other side of the element by outlet which is connected to a low pressure source. In the illustration of FIG. 2 the liquid is supplied along the direction of movement of the substrate relative to the final element, although this does not need to be the case. Various orientations and numbers of in- and out-lets positioned around the final element are possible; one example is illustrated in FIG. 3 in which four sets of an inlet with an outlet on either side are provided in a regular pattern around the final element, as indicated by arrows.

Figure 4:
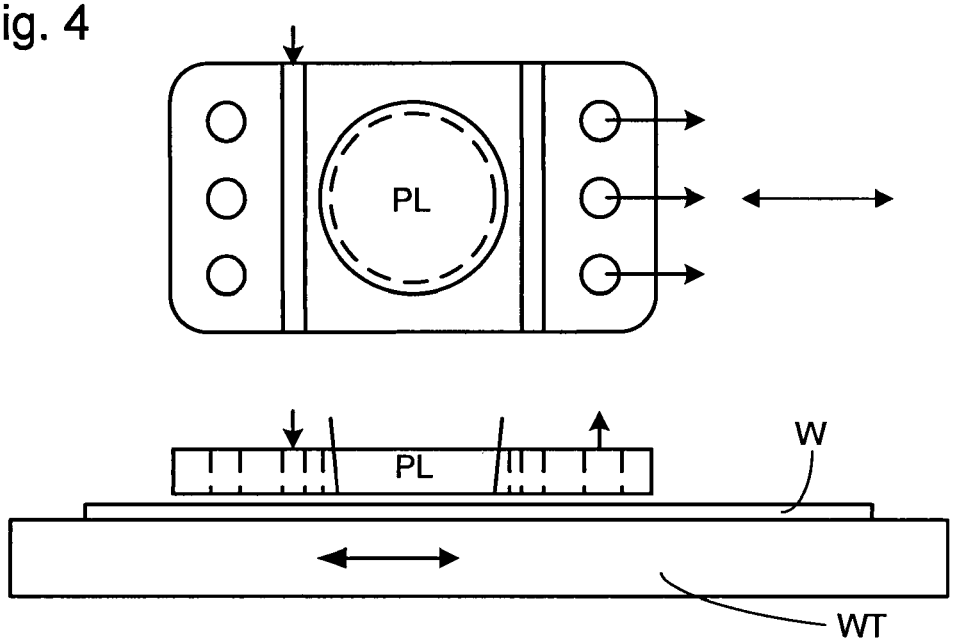
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Figure 5:
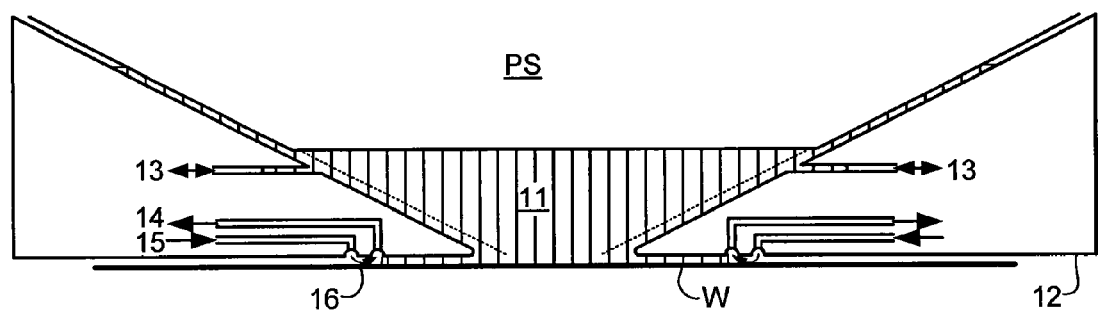
FIG. 5 depicts a further liquid supply system for use in a lithographic projection apparatus.

Another arrangement which has been proposed is to provide the liquid supply system with liquid confinement structure which extends along at least a part of a boundary of the space between the final element of the projection system and the substrate table. Such an arrangement is illustrated in FIG. 5. Arrows indicate the direction of flow.

FIG. 5 schematically depicts a localized liquid supply system or fluid handling structure with a liquid confinement structure 12, which extends along at least a part of a boundary of the space 11 between the final element of the projection system PS and a facing surface (e.g. the substrate table WT or substrate W). (Please note that reference in the following text to surface of the substrate W also refers in addition, or in the alternative, to a surface of the substrate table WT, unless expressly stated otherwise. Reference to movement of the substrate relative to another object, for example a projection system, includes reference to movement of the substrate table relative to the same object, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W. The seal may be a contactless seal such as a gas seal (such a system with a gas seal is disclosed in United States patent application publication no. US 2004-0207824) or fluid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round or any other suitable shape. At the bottom, the inner periphery closely conforms to the shape of the image field, e.g., rectangular, though this need not be the case.

The liquid may be contained in the space 11 by a gas seal 16 which, during use, is formed between the bottom of the liquid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11 i.e. the outlet 14 and inlet 15 act as a meniscus pinning feature. Such a system is disclosed in United States patent application publication no. US 2004-0207824, which is hereby incorporated by reference in its entirety. In another embodiment, the liquid confinement structure 12 does not have a gas seal.

Another system uses a porous member to which an under pressure is applied to extract liquid from the gap between the substrate and the liquid confinement structure 12 thereby to pin the meniscus.

An embodiment of the invention relates to a system which uses a meniscus pinning device which pins the edge of liquid, e.g. in the form of a liquid meniscus, in a space 11 between the final element of the projection system and the substrate and/or substrate table substantially in place. The meniscus pinning arrangement relies on the so-called gas drag extractor principle which has been described, for example, in U.S. patent application publication no. 2008/0212046, which is hereby incorporated by reference in its entirety. In that system the extraction holes may be placed in a cornered shape. The corners are aligned with a direction of relative motion between the projection system and the substrate and/or substrate table, for example the stepping and scanning directions. This helps reduce the force on the meniscus between two outlets for a given speed in the direction of relative motion compared to a case where the two outlets are aligned perpendicular to the direction of relative motion. However, an embodiment of the invention may be applied to a fluid handling structure which, in plan, may have any shape, or to a fluid handling structure that has a component part such as the one or more extraction openings arranged in any shape. Such a shape in a non-limiting list may include an ellipse (such as a circle), a rectilinear shape (such as a rectangle, e.g. a square, or parallelogram, e.g., a rhombus) or a cornered shape with more than four corners (such as a four or more pointed star).

In a variation of the system of US 2008/0212046, to which an embodiment of the invention relates, the geometry of the cornered shape in which the one or more openings are arranged allows sharp corners (selected from the range of about 60° to 90°, desirably the range of 75° to 90° and most desirably the range of 75° to 85°) to be present for the corners aligned both in the preferred directions of relative motion, for example, in the scanning and in the stepping directions. This may allow increased speed in the direction of each aligned corner. This is because the creation of liquid droplets due to an unstable meniscus in the scanning direction is reduced. Where corners are aligned with both the scanning and stepping directions, increased speed may be achieved in those directions. Desirably the speed of movement in the scanning and stepping directions may be substantially equal.

An embodiment of the present invention will be described with reference to a gas drag extractor fluid handling system. However, the present invention may be used in any other type of fluid handling system. The supply liquid opening and extraction liquid opening described below can be provided radially outwardly of meniscus pinning features of any type of liquid handling system e.g. gas flow (FIG. 5), liquid flow (FIG. 3), porous extractor, etc. In this way, as described below, large droplets which could cause imaging defects if they collided with the meniscus extending between the facing surface and the meniscus pinning feature can be prevented from reaching the meniscus.

Figure 6:
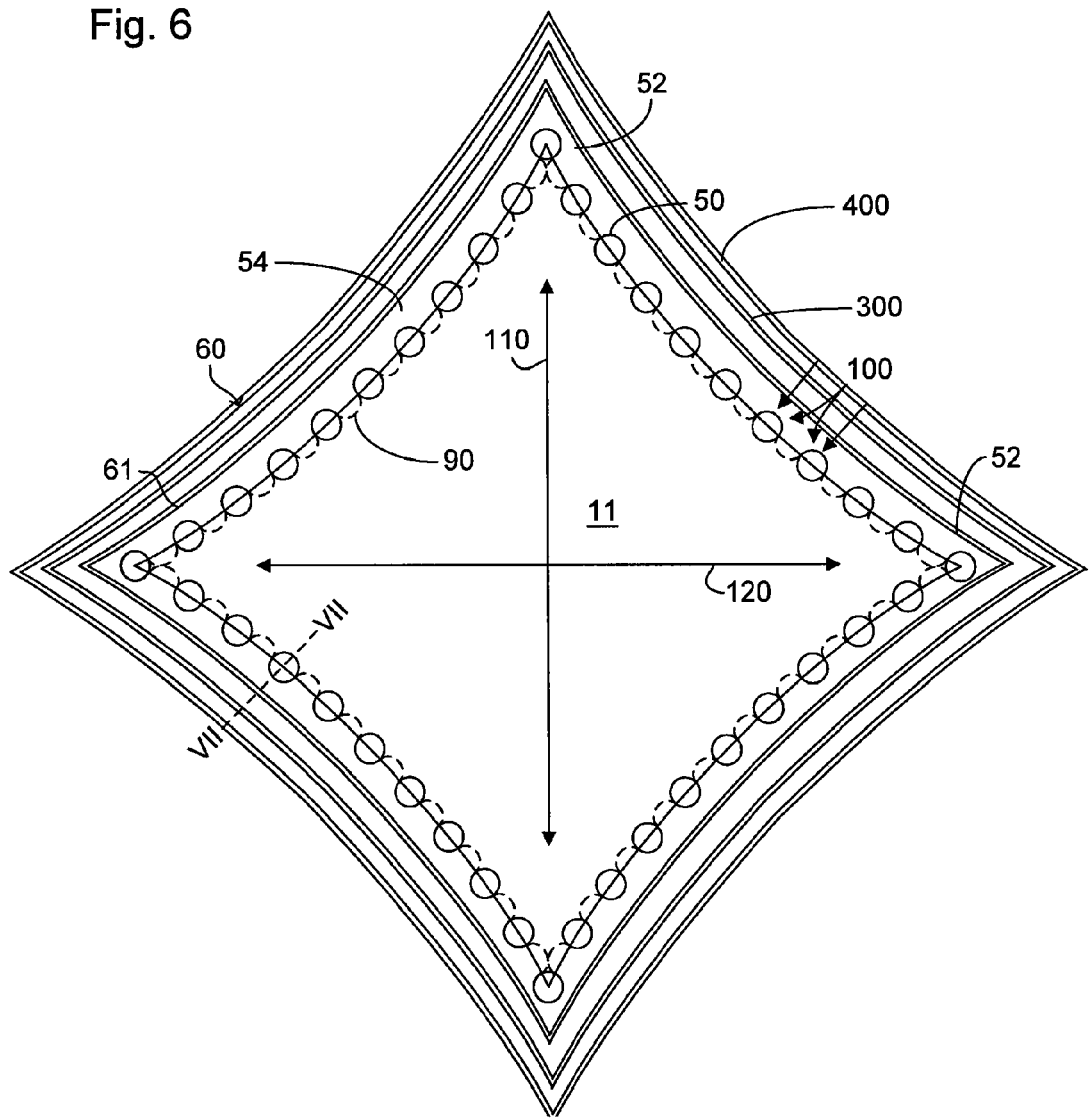
FIG. 6 is a schematic illustration, in plan, of a meniscus pinning system according to an embodiment of the present invention.

FIG. 6 illustrates schematically and in plan the meniscus pinning features of part of a fluid handling structure in accordance with an embodiment of the invention. The features of a meniscus pinning device are illustrated which may, for example, replace the meniscus pinning arrangement 14, 15, 16 of FIG. 5. The meniscus pinning device of FIG. 6 comprises one or more openings 50 arranged in a first line or pinning line. In an embodiment, there are a plurality of openings 50. Each of these openings 50 are illustrated as being circular though this is not necessarily the case. Indeed one or more of the openings 50 may be one or more selected from a circle, square, rectangular, oblong, triangular, an elongate slit, etc. Each opening of the plurality of openings has, in plan, a length dimension (i.e. in the direction from one opening to the adjacent opening) of greater than 0.2 mm, desirably greater than 0.5 mm or 1 mm, in an embodiment selected from the range of 0.1 mm to 10 mm, in an embodiment selected from the range of 0.25 mm to 2 mm. In an embodiment the length dimension is selected from the range of 0.2 mm to 0.5 mm, desirably the range of 0.2 mm to 0.3 mm. In an embodiment, the width of each opening is selected from the range of 0.1 mm to 2 mm. In an embodiment, the width of each opening is selected from the range of 0.2 mm to 1 mm. In an embodiment, the width of each opening is selected from the range of 0.35 mm to 0.75 mm, desirably approximately 0.5 mm.

Each of a plurality of openings 50 of the meniscus pinning device of FIG. 6 may be connected to a separate under pressure source. Alternatively or additionally, each or a plurality of the openings 50 may be connected to a common chamber or manifold (which may be annular) which is itself held at an under pressure. In this way a uniform under pressure at each or a plurality of the openings 50 may be achieved. The opening 50 can be connected to a vacuum source and/or the atmosphere surrounding the fluid handling structure or system (or confinement structure, barrier member or liquid supply system) may be increased in pressure to generate the desired pressure difference.

In the embodiment of FIG. 6 the opening 50 is a fluid extraction opening. The opening 50 is an inlet for the passage of gas and/or liquid into the fluid handling structure. That is, the opening may be considered as an outlet from the space 11. This will be described in more detail below.

The opening 50 is formed in a surface of a fluid handling structure 12. That surface faces a facing surface, such as the substrate and/or substrate table, in use. In one embodiment the opening is in a flat surface of the fluid handling structure. In another embodiment, a ridge may be present on the surface of the fluid handling structure facing the substrate. In that embodiment the opening 50 may be in the ridge. In an embodiment, the plurality of openings 50 may be defined by needles or tubes. The bodies of some of the needles, e.g., adjacent needles, may be joined together. The needles may be joined together to form a single body. The single body may form the shape which may be cornered. Liquid is provided radially inwardly of the opening 50 through one or more supply openings 40 (not illustrated in FIG. 6, but illustrated in FIGS. 8-11) in the undersurface 51.

Figure 7:
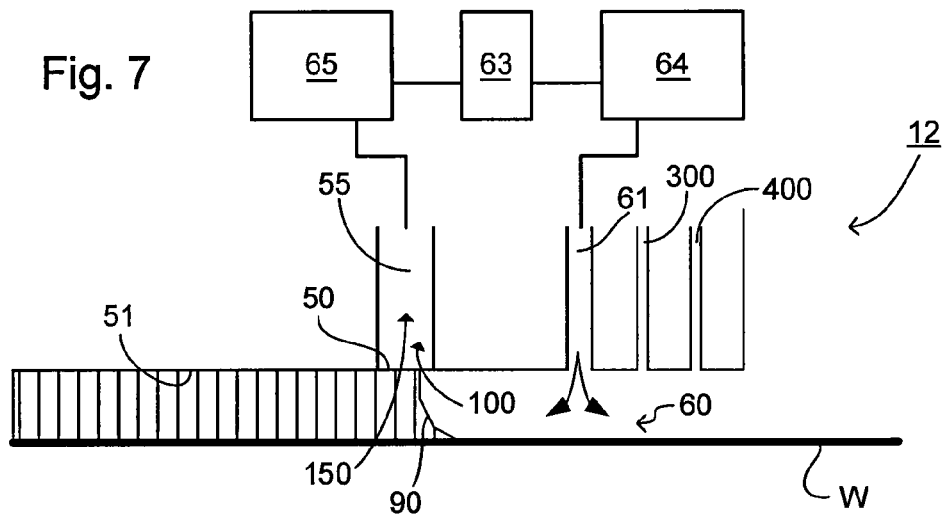
FIG. 7 depicts, in cross-section in part along line VII-VII in FIG. 6 and in a plane substantially perpendicular to a surface under a fluid handling structure, a meniscus pinning system for use in an embodiment of the present invention.

As can be seen from FIG. 7, each or a plurality of openings 50 are the end of a tube or elongate passageway 55, for example. Desirably the opening 50 is positioned such that it faces the substrate W in use. The rim (i.e. outlet out of a surface) of the opening 50 is substantially parallel to a top surface of the substrate W. The opening 50 is directed, in use, towards the substrate W and/or substrate table WT configured to support the substrate. Another way of thinking of this is that an elongate axis of the passageway 55 to which the opening 50 is connected is substantially perpendicular (within +/−45°, desirably within 35°, 25° or even 15° from perpendicular) to the top surface of the substrate W.

The opening 50 is designed to extract a mixture of liquid and gas. The liquid is extracted from the space 11 whereas the gas is extracted from the atmosphere on the other side of the opening 50 to the liquid. This creates a gas flow as illustrated by arrows 100 and this gas flow is effective to pin the meniscus 90 between the opening 50 substantially in place as illustrated in FIG. 6. The gas flow helps maintain the liquid confined by momentum blocking, by a gas flow induced pressure gradient and/or by drag (shear) of the gas flow on the liquid.

The opening 50 surrounds the space to which the fluid handling structure supplies liquid. That is, the opening 50 may be distributed around the surface of the fluid handling structure facing the substrate and/or substrate table. A plurality of the openings 50 may be substantially continuously spaced around the space. In an embodiment the spacing between some of the adjacent openings may be the same, although the spacing between adjacent openings 50 may vary. In an embodiment, liquid is extracted all the way around the shape which may be cornered. Liquid is extracted substantially at the point at which it impinges on the shape. This is achieved because the opening 50 is formed all the way around the space (in the shape). In this way the liquid may be confined to the space 11. The meniscus may be pinned by the opening 50, during operation.

As can be seen from FIG. 6, the opening 50 may be positioned so as to form, in plan, a cornered shape (i.e. a shape with corners 52). In the case of FIG. 6 the shape is a quadrilateral, such as a rhombus, e.g. a square, with curved edges or sides 54. The edges 54 may have a negative radius. An edge 54 may curve towards the center of the cornered shape, for example along a portion of the edge 54 located away from the corners 52. However, the average of the angle of all points on the edge 54 relative to a direction of relative motion may be referred to as a line of average angle which may be represented by a straight line without curvature.

Principal axes 110,120 of the shape may be aligned with the major directions of travel of the substrate W under the projection system. This helps to ensure that the maximum scan speed is faster than if the opening 50 were arranged in a shape in which the direction of movement is unaligned with an axis of the shape, for example a circular shape. This is because the force on the meniscus between two openings 50 may be reduced if the principal axes are aligned with a direction of relative motion. For example, the reduction may be a factor $\cos \theta$. '$\theta$' is the angle of the line connecting two adjacent openings 50 relative to the direction in which the substrate W is moving.

The use of a square shape allows movement in the step and scanning directions to be at a substantially equal maximum speed. This may be achieved by having each of the corners 52 of the shape aligned with the scanning and stepping directions 110, 120. If movement in one of the directions, for example the scan direction, is preferred to be faster than movement in the other direction, for example the step direction, then the shape may be a rhombus. In such an arrangement the primary axis of the rhombus may be aligned with the scan direction. For a rhombic shape, although each of the corners may be acute, the angle between the line of average angle of two adjacent sides (or edges) of the rhombus, for example relative to a direction of relative motion in the stepping direction, may be obtuse, i.e. more than 90° (for example selected from the range of about 90° to 120°, in an embodiment selected from the range of 90° to 105°, in an embodiment selected from the range of 85° to 105°.

Throughput can be optimized by making the primary axis of the shape of the opening 50 aligned with the major direction of travel of the substrate (usually the scan direction) and to have another axis aligned with the other major direction of travel of the substrate (usually the step direction). It will be appreciated that any arrangement in which $\theta$ is different to 90° will give an advantage in at least one direction of movement. Thus, exact alignment of the principal axes with the major directions of travel is not vital.

An advantage of providing the edges with a negative radius is that the corners may be made sharper. An angle selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to be 90°. If it was desired that a corner would have an angle of less than 90°, it would be necessary to select corners aligned with a direction of relative motion to be less than 90°. The other corners would have an angle of greater than 90°.

The opening 50 may be arranged in a star shape. In an embodiment of a star shape, the edges are straight instead of curved. The edges may meet at a point, e.g. an intermediate corner, which is radially inwardly of a straight line between two corners 52. This arrangement may not be as successful in pinning a meniscus at a high relative speed as an arrangement in which the edge between two adjacent corners 52 defined by the line of the opening(s) 50 is smooth. Such a line defined by the opening(s) 50 may define the cornered shape, is continuous and has a continuously changing direction. In the star shape embodiment, the intermediate corner along the side of the shape may pin the meniscus. The sharper a corner, the more the forces pinning the meniscus are focused on the corner. At a sharp corner, the pinning forces are focused on a short length of the edge of the shape. A corner with a smoother curve than a sharp corner, for example, a corner with a larger radius of curvature, has a longer length and so distributes the pinning forces along a longer curve of the corner, i.e. around the corner. Thus, for a certain relative velocity between the substrate and the fluid handling structure, the effective meniscus pinning force applied to both corners is the same. However, for a defined length of the edge, the effective pinning force for the sharp corner is more than for the smoothly curved corner. The meniscus pinned at a sharp corner is more unstable at a lower relative velocity between the substrate and the fluid handling structure than a meniscus pinned by the smoothly curved corner.

Radially inwardly of the opening 50 may be provided one or more openings (not shown) through which liquid is provided to the gap between the undersurface of the fluid handling system 12 and the facing surface.

Immersion liquid droplets may escape from the space 11 in which the immersion liquid is confined during relative movement under the space 11 of, for example, a height step in the surface facing the space (such as a gap between an edge of a substrate W and an edge of a recess in the table supporting the substrate or the surface of a sensor), and when the relative speed between the fluid handling structure and the facing surface, e.g. scanning speed, is larger than a critical speed (this might be necessary when a higher scanning speed/throughput is required). Such a critical speed may be dependent on at least one property of the facing surface.

In escaping from the immersion liquid in the space, the droplet breaks from the meniscus 90 of the immersion liquid between the fluid handling structure and a facing surface (such as a substrate W or a substrate table WT which supports the substrate W). The meniscus may be pinned to the fluid handling structure 12 by the fluid extraction opening 50 (the liquid extractor) which may extract liquid and gas in a two phase fluid flow. The droplet may escape from a trailing side of the immersion space 11 with respect to the movement of the facing surface.

In moving with the facing surface (with respect to the fluid handling structure 12) the droplet may then encounter a gas knife 61 which directs the droplet back to the liquid extractor. However, sometimes the conditions may be such that the droplet is blocked from moving further away from the meniscus 90 by the gas knife 61. Sometimes such a droplet may pass beyond the gas knife 61. In an embodiment the droplet has escaped the influence of a component of the fluid handling structure 12. In another embodiment, the droplet will encounter a further extractor and gas knife which may serve to extract and/or block the movement of the droplet away from the meniscus.

When the relative motion between the fluid handling structure 12 and the facing surface in the plane of the facing surface, e.g. the scanning or stepping direction is changed, such a droplet can move relative to the fluid handling structure 12 back towards the liquid meniscus 90. The droplet may at least partly be stopped by a gas knife 61 it first passed when escaping from the meniscus 90. The droplet may be sufficiently large that it passes the gas knife 61 towards the meniscus 90. The droplet may be extracted by extraction through the extraction opening 50 provided at or at least near the edge or boundary of the immersion liquid confined in the space 11. However, if such a droplet is not extracted completely it can create a bubble on collision with the liquid meniscus 90 of the liquid confined in the space.

The droplet may be insufficiently large and/or have insufficient speed to pass the gas knife 61 towards the meniscus 90. The droplet may merge with one or more droplets which may be small to form a bigger droplet in front of the gas knife 61. In this case, the gas knife 61 may be overloaded with immersion liquid, allowing the merged droplet to pass. Such a droplet will move relative to the fluid handling structure 12 towards the meniscus 90 and may potentially create one or more bubbles.

A problem solved with an embodiment of the invention is that in order to remove a droplet from the facing surface, and prevent it from entering the meniscus 90, the droplet needs to make contact with an extractor. Because, for example, 40 µm high droplets may cause a bubble in the space 11 which is large enough to cause an imaging defect, the (fly) height FH of the fluid handling structure 12 above the facing surface should be as low as 40 µm. However, this is very difficult from a mechanical point of view, for reasons such as tolerances and collision danger.

In an embodiment, the effective fly height EFH is reduced by adding one or more droplets of liquid (hereinafter reference to droplets in this context also includes additionally or alternatively a film of liquid) on the undersurface 51 of the fluid handling structure 12. When a droplet makes contact with the liquid on the undersurface, it is (at least partly) absorbed by the liquid on the undersurface and removed from the facing surface. The droplet on the facing surface is then extracted through an extractor. The liquid on the undersurface 51 can be as thick as 100-150 µm (for example where the fly height FH is larger than the liquid on the undersurface of course). If the facing surface accidentally hits the liquid on the undersurface 51, no damage occurs to the facing surface or fluid handling structure 12.

Figure 11:
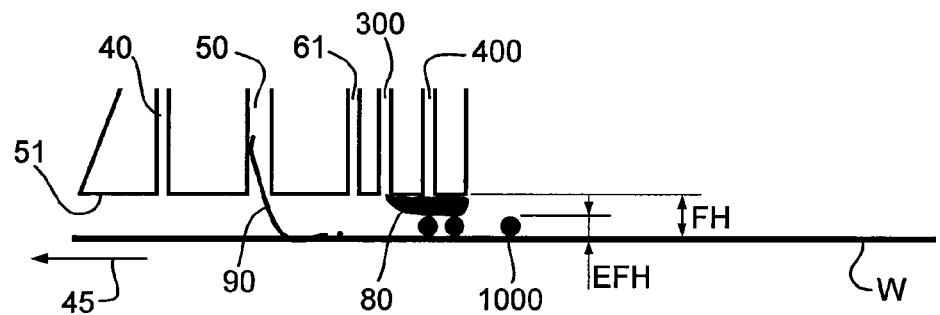
FIG. 11 is a schematic view, in cross-section, of an embodiment.

Accordingly, a significant improvement in the extraction of droplets on the facing surface may result by the imaginary lowering of the fly height of the fluid handling structure 12 by means of a wet fluid handling structure 12 undersurface 51. Wetting of the fluid handling structure 12 undersurface 51 can be achieved by: small liquid droplets hanging on the undersurface of the fluid handling structure and/or a liquid flow over the undersurface 51 going from a liquid supply to an extraction. Normally liquid droplets with a height lower than the fly height FH will not be extracted without touching the undersurface 51 (see FIG. 8). By "lowering" the fly height with liquid 80 (droplets/film) the returning droplets on the facing surface will hit the liquid 80 hanging on the undersurface 51, merge with the liquid 80 and will be extracted (FIGS. 9 and 11). The effective fly height EFH can be changed mechanically by geometry changes of the fluid handling structure 12 or with one or more liquid 80 droplets (e.g. by varying their size) as discussed herein.

Figure 8:
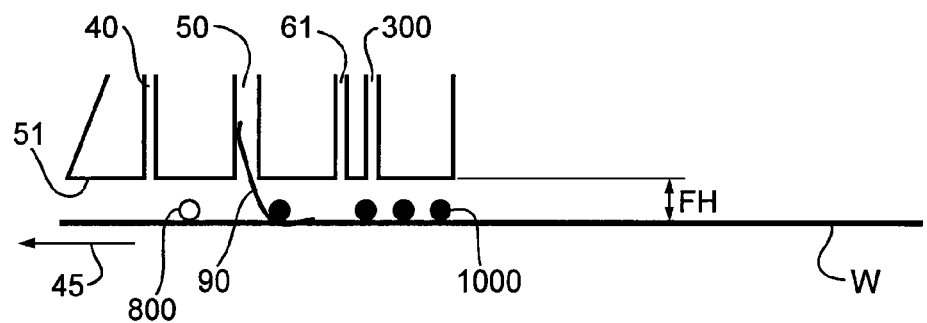
FIG. 8 depicts schematically, in cross-section, an example origin of an imaging error.
Figure 9:
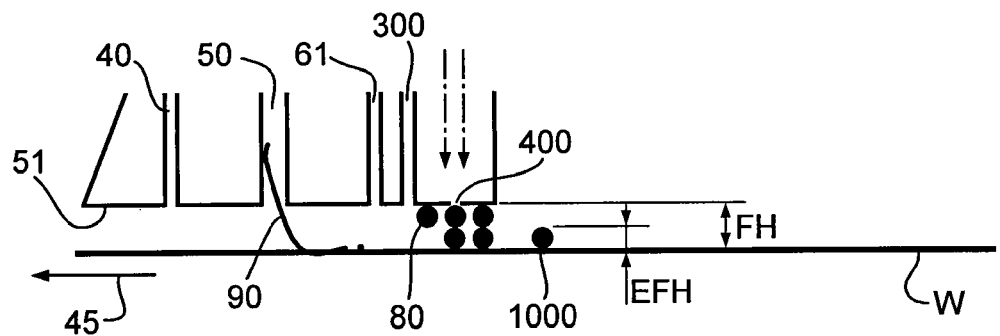
FIG. 9 illustrates schematically, in cross-section, the mechanism by which the fluid handling system of an embodiment reduces the chance of an imaging error.
Figure 10:
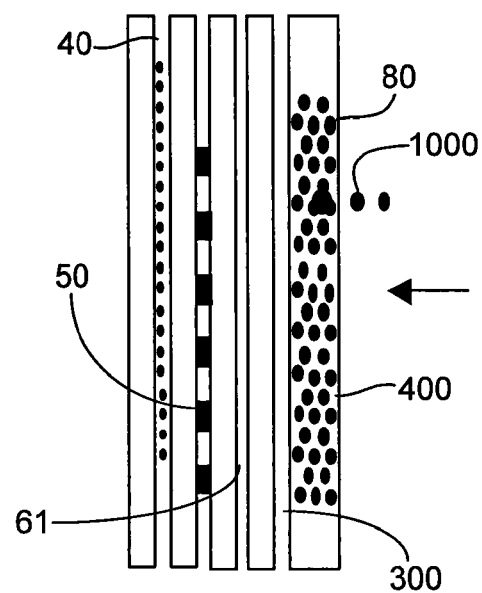
FIG. 10 is a schematic illustration, in plan, of FIG. 9.

In an embodiment, a significant reduction of the (amount and) size of the droplets passing a gas knife 61 towards a meniscus 90 during a change in the scanning direction may be achieved by adding one or more extra extraction openings 300 and one or more liquid supply openings 400 close to the gas knife 61, as shown, for example, in FIGS. 6-12. The liquid supply opening 400 may be, for example, a porous material or a porous plate as illustrated in FIGS. 9 and 10.

The extra extraction opening 300 and liquid supply opening 400 may prevent large droplets from passing the gas knife 61 and colliding with the meniscus 90. Other arrangements to provide and remove liquid from the undersurface 51 of the fluid handling structure 12 may be possible.

The extra extraction and supply may each be provided by a single elongate opening or a plurality of openings for example in a line.

Thus, as can be seen in FIG. 6, one or more extraction openings 300 surround the gas knife 61 and one or more supply openings 400 surround the extraction opening 300. Liquid 80 is supplied through the supply opening 400 onto the lower surface or undersurface 51 of the fluid handling structure 12. As will be discussed below with reference to FIGS. 8 and 9, this results in the chance of a large droplet colliding with the meniscus 90 being reduced.

FIG. 7 illustrates that the opening 50 is provided in the undersurface 51 of the fluid handling structure 12. This is however not necessarily the case and the opening 50 may be in a protrusion from the undersurface 51 of the fluid handling structure 12. Arrow 100 shows the flow of gas from outside of the fluid handling structure 12 into a passageway 55 associated with the opening 50. Arrow 150 illustrates the passage of liquid from the space into the opening 50. The passageway 55 and opening 50 are desirably designed so that two phase extraction (i.e. gas and liquid) desirably occurs in an annular flow mode. In annular gas flow gas may substantially flow through the center of the passageway 55 and liquid may substantially flow along the wall(s) of the passageway 55. A smooth flow with low generation of pulsations results.

There may be no meniscus pinning feature radially inwardly of the opening 50. The meniscus 90 may be pinned by the opening 50 with drag forces induced by gas flow into the opening 50. A gas drag velocity of greater than about 15 m/s, desirably 20 m/s is sufficient. The amount of evaporation of liquid from the substrate may be reduced thereby reducing both splashing of liquid as well as thermal expansion/contraction effects.

A plurality of discrete needles (which may each include an opening 50 and a passageway 55), for example at least thirty-six (36), each with a diameter of 1 mm and separated by 3.9 mm may be effective to pin a meniscus. In an embodiment, 112 openings 50 are present. The openings 50 may be square, with a length of a side of 0.5 mm, 0.3 mm, 0.2 mm or 0.1 mm.

Other geometries of the bottom of the fluid handling structure are possible. For example, any of the structures disclosed in U.S. patent application publication no. US 2004-0207824 could be used in an embodiment of the invention.

As can be seen in FIG. 6, an elongate aperture 61 (which may be slit shaped) is provided outside the opening 50. The elongate aperture 61 may be located further away from the space containing the immersion fluid than the opening 50 arranged in the first line. The aperture 61 may be substantially parallel to the first line in which the opening 50 is arranged. The elongate aperture may form a second line or knife line. The second line may surround the periphery of the shape formed by the opening 50. In an embodiment the elongate aperture is continuous and may completely surround the shape formed by the first line. In use, the aperture 61 is connected to an over pressure source. Gas flowing from the aperture 61 may form a gas knife 60 surrounding the meniscus pinning system formed by opening 50. The function of this gas knife will be described below. In an embodiment the elongate aperture comprises a plurality of discrete apertures (which may be elongate) along a side 54 of the shape. The plurality of apertures may be arranged in series.

It may be desirable to maintain a constant separation between adjacent apertures 61 (where a plurality of apertures is present along the second line) and adjacent opening 50. In an embodiment this is desirable along the length of the center lines of the apertures 61 and opening 50. In an embodiment the constant separation may be in the region of one of more corners of the fluid handling device.

The gas knife 60 is desirably close enough to the opening 50 to create a pressure gradient across the space between them. There is desirably no stagnant zone in which a layer of liquid (e.g., a liquid droplet or liquid film) can accumulate, for example beneath the fluid handling structure 12. In an embodiment, the flow rate of gas through the opening 50 may be coupled to the gas flow rate through the elongate aperture 61 as described in U.S. Patent Application Publication No. US 2010-0313974 and U.S. Patent Application Publication No. US 2007-0030464, which are each hereby incorporated by reference in their entirety. The gas rate may therefore be directed substantially inwardly from the aperture 61 to the opening 50. Where the gas flow rate through the opening 50 and the aperture 61 is the same, the flow rate may be referred to as 'balanced'. A balanced gas flow is desirable as it reduces or minimizes the thickness of a liquid residue, e.g. film.

As described elsewhere herein, the opening 50 may be arranged to form any closed shape which may include in a non-limiting list, e.g. a quadrilateral such as a parallelogram, a rhombus, a rectangle, a square, or ellipse such as a circle. In each case the aperture 61 for the gas knife 60 may have a substantially similar shape as the shape formed by the opening 50. The separation between the edge of the shape formed by the opening 50 and the shape formed by the aperture 61 is within the aforementioned ranges. In an embodiment the separation is desirably constant.

Figure 12:
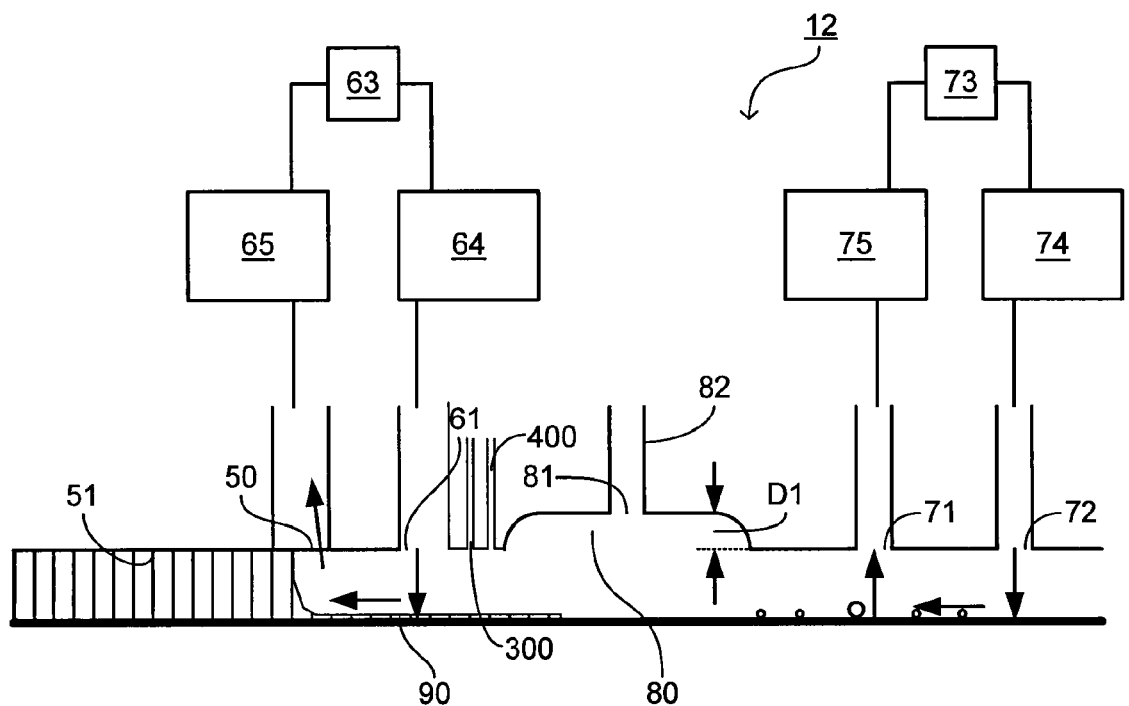
FIG. 12 depicts, in cross-section in a plane substantially perpendicular to a surface under a fluid handling structure, a part of a fluid handling structure according to an embodiment of the present invention.

FIG. 8 illustrates a problem addressed by an embodiment of the present invention and FIGS. 9-11 describe how an embodiment of the invention works. The principles are applicable both to the embodiment of FIGS. 6 and 7 as well as the embodiment of FIG. 12, illustrated below as well as any other localized area fluid handling structure. Furthermore, the principles are relevant to any fluid handling system in which an embodiment of the invention is applied radially outwardly of, for example, the meniscus pinning feature(s) of the fluid handling system which maintain the liquid in the space 11.

An embodiment of the invention comprises an arrangement or mechanism to apply liquid to and extract liquid from an undersurface 51 of a liquid confinement system 12. In an embodiment, a liquid extraction opening or openings 300 is provided. In an embodiment, (radially outwardly of the liquid extraction opening or openings 300) a liquid supply opening or openings 400 is provided. The liquid extraction opening or openings 300 and liquid supply opening or openings 400 may be the other way around, relative to the optical axis of the projection system PS of the lithographic apparatus.

FIG. 8 illustrates the difficulty if, for example, no liquid is supplied to the undersurface 51 of the fluid handling system 12. Although an extraction opening 300 is present radially outwardly of the gas knife 61, large droplets 1000 on the facing surface (in this case the substrate W) pass under the extraction opening 300 (when the substrate W passes in the direction of arrow 45 under the liquid confinement structure 12) to collide with the meniscus 90 extending between the facing surface (the substrate W) and the meniscus pinning feature (e.g., the opening 50). When the large droplet 1000 collides with the meniscus 90 gas can be included into the liquid in the space 11 between the final element of the projection system PS and the substrate as a bubble 800. This can result in an imaging error.

One way of dealing with the above mentioned problem is to reduce the distance between the undersurface 51 of the fluid handling structure 12 and the facing surface. However, this can lead to difficulties because of the increased risk of collision between the fluid handling structure 12 and the facing surface.

An embodiment of the present invention addresses, for example, this issue by introducing an "imaginary" reduced fly height (distance between the undersurface 51 and the facing surface). This is achieved, as illustrated in FIG. 9, by providing liquid 80 on the undersurface 51 of the fluid handling structure 12. When droplet 1000 on the facing surface comes into contact with the liquid 80 on the undersurface 51, the two liquid meniscuses combine. It is then possible for the extractor 300 to extract the combined liquid through the fluid handling structure 12 so that the droplet 1000 is removed from the facing surface or is made smaller. A small droplet colliding with the meniscus 90 is likely not a problem as little gas is included into the space. Any such gas may dissolve into the liquid before the gas reaches the path the beam PB takes through the liquid onto the substrate W.

FIG. 10 illustrates, in plan, the embodiment of FIG. 9. As can be seen the liquid 80 on the undersurface 51 may be in the form of droplets. Alternatively, as illustrated in FIG. 11, the liquid may be in the form of a film. Any embodiment will work and any way of achieving liquid 80 on the undersurface 51 will work. In an embodiment (e.g. FIGS. 9 and 10) a porous member is used to define the liquid supply opening 400. In an embodiment (e.g. FIGS. 6, 7 and 11) an elongate slit defines the liquid supply opening 400. The form of the liquid 80 on the undersurface is determined by the nature of the liquid supply opening or openings 400 and the liquid extraction opening or openings 300.

FIG. 12 schematically depicts in cross-section a part of a fluid handling structure according to an embodiment of the invention. At the boundary between the space 11 in which the liquid is contained and a region that is external to the fluid handling structure, for example in the ambient atmosphere external to the fluid handling structure, the opening 50 and the aperture 61 may be arranged in the manner discussed above. The opening 50 may be arranged in a first line for use in extracting liquid from the space into the fluid handling structure. The aperture 61 may be provided in a second line and arranged to form a gas knife device. The gas from the gas knife may force liquid towards the opening 50 in the first line. In an embodiment of the invention, either an elongate opening or a plurality of openings 50 may be used in the first line for use in extracting liquid from the space into the fluid handling structure.

One or more openings 71 may be provided in a third line, or droplet line, further away from the immersion liquid than the first and second lines. A second gas knife device is formed by an aperture 72 arranged in a fourth line, or droplet knife line. (In an embodiment, the aperture 72 has a plurality of apertures 72). The fourth line is arranged to be further from the space 11 containing the immersion liquid than the third line. The gas flow through the second gas knife device may be mainly directed inwardly so that most of it passes through the opening 71. In an embodiment the gas flow through the opening 71 and the aperture 72 of the second gas knife device is balanced.

The fluid handling structure of this embodiment includes a first gas knife device operating in conjunction with opening 50. This combination performs the primary extraction of immersion liquid.

The fluid handling structure has a second gas knife device operating with the third opening 71. The provision of an additional combination of one or more openings and associated gas knife has been found to be unexpectedly beneficial.

An arrangement such as that depicted in FIG. 7, with a single gas knife device and a single associated opening line, may leave a residue of liquid on the surface of the substrate W and/or substrate table WT. The liquid residue may be in the form of a liquid film or a plurality of droplets. After a while, the film may break up into a plurality of droplets. The droplets may grow into larger droplets and may become unacceptably large. The liquid residue may be left, as explained herein, when the scan speed exceeds the critical scan speed for a portion of the facing surface. This may, for example, occur when the scan speed increases for a surface with a continuous contact angle beyond the critical scan speed for the surface. The liquid residue may be left in the location of a portion of a surface where the contact angle changes so the critical scan speed for that portion decreases so the scan speed exceeds the critical scan speed, even if the scan speed is constant. Such a portion may be an edge of a feature, such as the edge of the substrate, a shutter member, a sensor or a sensor target, for example at the moment when the liquid meniscus crosses the edge.

In arrangements in which the gas knife device is decoupled from the line of openings 50, 71 by a connection to atmospheric pressure, for example by a space that is connected to atmosphere and is located between the gas knife device and the openings 50, 71, further problems may occur. Liquid may accumulate between the gas knife device and the openings, creating large droplets. When the direction of movement from the substrate W and/or substrate table WT relative to the projection system PS and the fluid handling structure changes, such large droplets may collide with the advancing meniscus of the immersion liquid. The collision of a droplet with the meniscus may cause an inclusion of gas, creating a bubble which may be small or larger. Furthermore, a disturbance of the meniscus caused by the collision may also form a bubble. Formation of a bubble is undesirable. An arrangement as described herein may help reduce one or more of the above or other problems. That is, radially outwardly of the inner gas knife 61, there is provided an arrangement or mechanism to provide liquid onto the undersurface of the fluid handling structure. This means that any droplets which form between the two gas knifes 61, 71 and which may coalesce can be prevented from colliding with the meniscus 90.

The provision in the fluid handling structure of two gas knife devices and associated openings for extraction permits the design and/or setting of process control parameters of each combination to be selected for the specific purpose of each combination, which may be different. The gas flow rate out of the aperture 61 in the second line, forming the first gas knife, may be less than the gas flow rate out of the aperture 72 in the fourth line forming the second gas knife device.

In an embodiment it may be desirable for the gas flow rate for the first gas knife device to be relatively low because, as explained above, the flow through opening 50 in the first line is in two phase, with a significant amount of liquid. If the flow rate through the aperture 61 in the second line and the opening 50 in the first line is an unstable two phase flow regime, for example the flow rate may be too high, the two phase flow may result in force variations, e.g. vibrations, which is undesirable. On the other hand, the more stable the flow regime, for example the lower the flow rate, through the aperture 61 in the second line and/or the opening 50 in the first line, the greater the leakage of immersion liquid past the gas knife device at a given speed of movement of the substrate W and/or substrate table WT relative to the projection system PS and the fluid handling structure. Therefore, the gas flow rate in a single gas knife arrangement was essentially a compromise between these two conflicting demands.

The provision in the fluid handling structure of the second gas knife device and associated extraction beneficially enables a lower flow rate to be used for the first gas knife device. The second gas knife device may be used to remove droplets of liquid that pass beyond the first gas knife device. Furthermore, the gas flow rate through the aperture 72 in the fourth line and the one or more openings 71 in the third line may be relatively high. This is because the flow is largely gas. Beneficially, this increased flow rate improves the performance of removal of liquid droplets from the surface of the substrate W and/or the substrate WT.

In an arrangement, the gas flow rate out of the aperture 61 in the second line to form the first gas knife device may be less than or equal to 100 liters per minute, desirably less than or equal to 75 liters per minute, or desirably approximately 50 liters per minute or less. In a particular arrangement, the gas flow rate out of the aperture 72 in the fourth line to form the second gas knife device may be greater than or equal to 60 liters per minute, desirably greater than or equal to 100 liters per minute, or desirably approximately 125 liters per minute or more.

In an embodiment, a controller 63 is provided to control the rate of flow of gas through the aperture 61 in the second line. In an embodiment, the controller 63 may also control the rate of flow of gas through the opening 50 in the first line. The controller 63 may control an overpressure source 64 (e.g. a pump) and/or an underpressure source 65 (e.g. a pump, possibly the same pump as provides the overpressure). The controller 63 may be connected to one or more suitable flow control valves in order to achieve the desired flow rates. The controller may be connected to one or more two phase flow rate meters associated with one or more openings 50 to measure the extracted flow rate, a flow rate meter associated with the aperture 61 to measure the supplied gas flow rate, or both. A suitable arrangement for a two phase flow meter is described in U.S. Patent Application Publication No. US 2011-0013159 which is hereby incorporated by reference in its entirety.

A controller 73 (which may be the same as the controller 63) is provided to control the rate of flow of gas through the aperture 72. The controller 73 also controls the rate of flow of gas through the one or more openings 71. The controller 73 may control an overpressure source 74 (e.g. a pump) and/or an underpressure source 75 (e.g. a pump, possibly the same pump as provides the overpressure). There may be one or more suitable control valves connected to and controlled by the controller 73 in order to provide the desired flow rates. The controller may control the values based on flow measurements supplied by one or more two phase flow meters arranged to measure the flow through the one or more openings 71, one or more flow meters arranged to measure the flow through the aperture 72, or both. Such an arrangement may be similar to the arrangement for the flow components associated with the first and second lines.

One or both of the controllers 63,73 may be configured to control the gas flow through the openings 50,71 in proportion to the gas flow rate of the corresponding gas knife. In an embodiment, the gas flow rate through the gas knife is up to 20% or up to 10% different from the total flow rate through the corresponding openings 50,71. In an embodiment the gas flow rate through openings 50, 71 may be controlled to match the gas flow through the corresponding one or more apertures 61,72. In an embodiment, the gas flow rate through the one or more apertures 61,72 or a gas knife may be substantially the same as the gas flow rate through the corresponding openings 50,71.

Arranging the gas flow rate through the openings 50,71 to match the gas flow rate of the respective gas knife may mean that substantially all of the gas flowing out of the gas knife flows into the corresponding opening 50,71. The gas flow may be inwards, towards the meniscus, or towards the source of the liquid residue. An isolated gas knife generates a substantially symmetric pressure peak, with gas flows in both directions away from that peak. However, because the gas flows are balanced for either or both of the gas knives in an embodiment, the gas knife instead may form a pressure gradient between the one or more apertures 61,72 of a gas knife and the corresponding openings 50,71. There may be little or no gas flow outwardly (rightwards in FIGS. 7 and 8), namely away from the space containing the immersion liquid, from either of the gas knives.

In an embodiment, the controllers 63,73 may control the activation of either or both gas knives such that it is active when it is, or may be, required. In other words, the gas knife may be switched off under appropriate predetermined conditions. For example, the gas knife may be switched off when the scan speed is safely below a critical speed and is switched on when the scan speed goes above, or is likely to go above, the critical speed for the surface currently under the meniscus or approaching the meniscus. For example, when a central portion of the substrate moves under the fluid handling structure 12, one or both of the gas knives may be switched off. The contact angle is constant over this portion of the substrate and the critical scan speed for the portion may be sufficiently high that it is not exceeded. Before, during and/or after the meniscus of the space moves over an edge, for example of the substrate, sensor, shutter member or sensor target, one or both of the gas knife devices may be operational.

In a configuration of lithographic apparatus, the inner gas knife in particular may not be required for any of the expected modes of operation of the apparatus. Accordingly, in an embodiment, the inner gas knife may be omitted. In such an embodiment, the aperture 61 in the second line may be omitted. There may be no requirement for an over pressure source 64. It should be appreciated that this variation of the apparatus of the invention may be applied in conjunction with other embodiments and variations discussed within this application.

The third and fourth lines, along which the one or more openings 71 and the aperture 72 are arranged, may generally follow the first and second lines along which the one or more openings 50 and the aperture 61 are formed. In an embodiment the shape formed by the one or more openings 71 is different from the shape formed by the one or more openings 50. It may be desirable for the third and fourth lines, e.g. in an embodiment the first to fourth lines, are parallel such that there is a constant separation between the lines.

In an embodiment, the width of the aperture 61 in the second line, namely in a direction transverse to the first to fourth lines, is selected from the range of from 40 to 75 μm, desirably approximately 50 μm.

In an embodiment, the aperture 72 in the fourth line, used to form the second gas knife device may have the same features as described with reference to the aperture 61 in the second line. As with the aperture 61 of the first gas knife device, the aperture 72 may be formed as a single slit or as a plurality of elongate apertures. In an embodiment, the width of the aperture 72 of the fourth line, namely in a direction transverse to the first to fourth lines, is selected from the range of from 20 μm to 50 μm, desirably 30 μm.

The one or more openings 71 in the third line may be formed as a single elongate slit or as a plurality of elongate openings. In an embodiment, the width of the one or more openings 71 in the third line, namely in a direction transverse to the first to fourth lines, is selected from the range of from 100 μm to 200 μm, desirably 150 μm. Alternatively, the one or more openings 71 in the third line may be arranged in a similar fashion to the one or more openings 50 in the first line.

In an embodiment, the lower surface 51 of the fluid handling structure may be arranged such that an outer portion of the lower surface extends away from the aperture 72 in the fourth line by at least 2 mm, desirably at least 5 mm. This outer portion 51a of the lower surface 51 of the fluid handling structure may, in conjunction with the surface of the substrate W and/or the substrate table WT, function as a damper, reducing the gas flow away from the one or more openings 71 in the third line. Accordingly, such an arrangement may reduce the leakage of liquid, for example in the form of droplets away from the fluid handling structure, especially at relatively high scan speed.

In the embodiment depicted in FIG. 12, a recess 80 is provided in the lower surface 51 of the fluid handling structure. The recess 80 may be provided in a fifth line, or a recess line, between the second and third lines. In an embodiment, the recess 80 is arranged such that it is parallel to any of the first to fourth lines, desirably at least the second line, the third line or both.

The recess 80 may include one or more openings 81 connected by a gas conduit 82 to atmosphere, such as the ambient atmosphere, for example to a region external to the fluid handling structure. The recess 80, desirably when connected to an external atmosphere, may function to decouple the first gas knife device and associated one or more openings 50 in the first line from the second gas knife device and associated one or more openings 71 in the third line. The recess 80 decouples the operation of the components located either side; so the features radially inward of the recess are decoupled from the features radially outward.

In general, it should be appreciated that the volume of the recess 80 should be sufficiently large in order to provide the desired function of decoupling the first and second gas knives. However, the larger the volume of the recess 80, the greater the likelihood the liquid collecting within the recess and/or the greater the amount of liquid that may collect within the recess 80. Such liquid collecting is undesirable because it may result in the formation of large droplets that are subsequently released onto the surface of the substrate W and/or substrate table WT. Alternatively or additionally, liquid collecting in the recess 80 may collide with the meniscus when there is a change in the scan direction, resulting in one or more of the problems discussed above.

The selection of the size of the recess 80 may be a compromise. In an embodiment, the depth D1 of the recess 80 relative to the lower surface 51 of the fluid handling structure may be selected from the range of from 0.25 mm to 0.75 mm, desirably about 0.5 mm. In an embodiment, the width of the recess 80, namely in the direction transverse to the first to fifth lines, may be selected from the range of from 1 mm to 15 mm, desirably the range of from 1 mm to 10 mm, or desirably the range of from 2 mm to 3 mm.

In an embodiment, the size of the recess 80 may be selected primarily in order to ensure the desired function of decoupling the first and second gas knives. For example, the size of the recess 80 may be larger than the examples provided above. In such an embodiment, additional measures may be taken to reduce the collection of liquid in the recess or to ameliorate the effects of any liquid collected in the recess or both.

The embodiment of FIG. 12 may be varied by providing a flat surface between the inner gas knife 61 and the outer extraction openings 71, or a step between them, or a sloped (desirably curved) surface between them and/or by omitting the inner gas knife 61 as taught in U.S. patent application Ser. No. 61/326,972, filed Apr. 22, 2010.

In the embodiment of FIG. 12, the extraction opening 300 and liquid supply opening 400 may be effective to prevent any large droplets caught between the two gas knives 61, 72 from colliding with the meniscus 90. The extraction opening 300 and supply opening 400 are illustrated on the undersurface 51 between the inner gas knife 61 and recess 80. In an embodiment the extraction opening 300 and supply opening 400 may be positioned between the recess 80 and extraction opening 71.

An embodiment of the invention may be used in a separate drying station.

As will be appreciated, any of the above described features can be used with any other feature and it is not only those combinations explicitly described which are covered in this application.

In an embodiment, there is provided a fluid handling structure for a lithographic apparatus, the fluid handling structure having, on an undersurface, a liquid supply opening or a plurality of liquid supply openings and a liquid extraction opening or a plurality of liquid extraction openings arranged such that, in use, liquid is provided on and removed from the undersurface of the fluid handling structure.

In an embodiment, a meniscus of the liquid provided on the undersurface is separate from a meniscus of liquid in a space configured to contain immersion fluid. In an embodiment, in use, the liquid provided on the surface is spaced apart by a gas gap from a surface facing the undersurface. In an embodiment, the fluid handling structure further comprises a further liquid supply opening or a plurality of further liquid supply openings to supply liquid inwardly, relative to a location where the patterned beam of the lithographic apparatus is to be projected, of the liquid supply opening or the plurality of liquid supply openings. In an embodiment, the liquid in contact with the undersurface flows from the liquid supply opening or plurality of liquid supply openings to the liquid extraction opening or liquid extraction openings as a film or as at least one droplet.

In an embodiment, there is provided a fluid handling structure for a lithographic apparatus, the fluid handling structure successively having, at a boundary from a space configured to contain immersion fluid to a region external to the fluid handling structure: a gas knife device having an elongate aperture in a first line; and a liquid supply opening or a plurality of liquid supply openings outward relative to the boundary of the gas knife.

In an embodiment, the fluid handling structure further comprises a liquid extraction opening or a plurality of liquid extraction openings, positioned outwardly of the gas knife relative to the boundary. In an embodiment, the liquid extraction opening or openings are inward, relative to the boundary, of the liquid supply opening or plurality of liquid supply openings. In an embodiment, the fluid handling structure is constructed and arranged to provide liquid in contact with an undersurface of the fluid handling structure provided by the liquid supply opening or plurality of liquid supply openings and extracted by the liquid extraction opening or plurality of liquid extraction openings. In an embodiment, the liquid in contact with the undersurface flows from the liquid supply opening or plurality of liquid supply openings to the liquid extraction opening or liquid extraction openings as a film or as at least one droplet. In an embodiment, liquid exiting the liquid supply opening or plurality of liquid supply openings does not form part of a meniscus of liquid extending between a facing surface which faces the fluid handling structure and the fluid handling structure. In an embodiment, the fluid handling structure further comprises an elongate opening or a plurality of openings to extract fluid therethrough arranged in a second line that, in use, is directed towards a facing surface which faces the fluid handling structure and is located inward, relative to the boundary, of the gas knife. In an embodiment, the fluid handling structure further comprises a second gas knife device, the second gas knife device located outward, relative to the boundary, of the liquid supply opening or plurality of liquid supply openings. In an embodiment, the fluid handling structure further comprises a second elongate opening or a plurality of second openings that, in use, is directed towards a facing surface which faces the fluid handling structure and is located inward, relative to the boundary, of the second gas knife device. In an embodiment, the second elongate opening or a plurality of second openings is located outward, relative to the boundary, of the liquid supply opening or plurality of liquid supply openings.

In an embodiment, there is provided a fluid handling structure for a lithographic apparatus, the fluid handling structure successfully having, at a boundary from a space configured to contain immersion fluid to a region external to the fluid handling structure: a meniscus pinning feature to pin a meniscus which extends between the fluid handling structure and a facing surface which faces the fluid handling structure; and a liquid supply opening or a plurality of liquid supply openings outwardly, relative to the boundary, of the meniscus pinning feature to provide liquid to an undersurface of the fluid handling structure.

In an embodiment, a meniscus of the liquid provided on the undersurface is separate from a meniscus of liquid in the space. In an embodiment, in use, the liquid provided on the surface is spaced apart by a gas gap from the facing surface. In an embodiment, the fluid handling structure further comprises a further liquid supply opening or a plurality of further liquid supply openings to supply liquid inwardly, relative to the boundary, of the liquid supply opening or the plurality of liquid supply openings.

In an embodiment, there is provided a device manufacturing method, comprising: providing a fluid between a final element of a projection system and a surface facing the final element and confining the fluid to a space through which a projection beam of radiation passes using a fluid handling structure; providing liquid to an undersurface of the fluid handling structure facing the surface at a location radially outward of the space; at least partly removing a droplet of liquid from the substrate by contacting the liquid on the substrate with the liquid on the undersurface of the fluid handling structure; and extracting the liquid through an extraction opening in the fluid handling structure.

In an embodiment, there is provided a fluid handling structure for a lithographic apparatus, the fluid handling structure having, on an undersurface, a liquid supply opening or a plurality of liquid supply openings to provide liquid on the undersurface such that, in use, the liquid hangs on the undersurface with a gas gap from a surface facing the undersurface at least until contacting with a liquid droplet on the facing surface. In an embodiment, the fluid handling structure further comprises a liquid extraction opening or a plurality of liquid extraction openings to remove liquid supplied by the liquid supply opening or a plurality of liquid supply openings.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid. In an embodiment, the immersion liquid may be water.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus, the fluid handling structure successively having, at a boundary from a space configured to contain immersion fluid to a region external to the fluid handling structure:
   a meniscus pinning feature to pin a meniscus which extends between the fluid handling structure and a facing surface which faces the fluid handling structure; and
   a liquid supply opening or a plurality of liquid supply openings outwardly, relative to the boundary, of the meniscus to provide liquid to an undersurface of the fluid handling structure, wherein, in use, the liquid provided on the undersurface is spaced apart by a gas gap from the facing surface.

2. The fluid handling structure of claim 1, wherein a meniscus of the liquid provided on the undersurface is separate from a meniscus of liquid in the space.

3. The fluid handling structure of claim 1, further comprising a further liquid supply opening or a plurality of further liquid supply openings to supply liquid inwardly, relative to the boundary, of the liquid supply opening or the plurality of liquid supply openings.

4. The fluid handling structure of claim 1, wherein the liquid provided to the undersurface flows from the liquid supply opening or the plurality of liquid supply openings to a liquid extraction opening or a plurality of liquid extraction openings as a film or as at least one droplet.

5. The fluid handling structure of claim 1, further comprising a liquid extraction opening or a plurality of liquid extraction openings to extract at least the liquid provided to the undersurface, the liquid extraction opening or the plurality of liquid extraction openings positioned, relative to the boundary, inwardly of the liquid supply opening or the plurality of liquid supply openings.

6. A fluid handling structure for a lithographic apparatus, the fluid handling structure successively having, at a boundary from a space configured to contain immersion fluid to a region external to the fluid handling structure:
    a meniscus pinning feature to pin a meniscus which extends between the fluid handling structure and a facing surface which faces the fluid handling structure; and
    a liquid supply opening or a plurality of liquid supply openings outwardly, relative to the boundary, of the meniscus pinning feature to provide liquid to an undersurface of the fluid handling structure, wherein, in use, the liquid provided on the undersurface is spaced apart by a gas gap from the facing surface, wherein the gas gap is smaller than a gap between the meniscus pinning feature and the facing surface and the liquid provided on the undersurface is nearer to the facing surface than any part of the fluid handing structure outwardly of the meniscus pinning feature.

7. The fluid handling structure of claim 6, wherein a meniscus of the liquid provided on the undersurface is separate from a meniscus of liquid in the space.

8. The fluid handling structure of claim 6, further comprising a further liquid supply opening or a plurality of further liquid supply openings to supply liquid inwardly, relative to the boundary, of the liquid supply opening or the plurality of liquid supply openings.

9. The fluid handling structure of claim 6, wherein the liquid provided to the undersurface flows from the liquid supply opening or the plurality of liquid supply openings to a liquid extraction opening or a plurality of liquid extraction openings as a film or as at least one droplet.

10. The fluid handling structure of claim 6, further comprising a liquid extraction opening or a plurality of liquid extraction openings to extract at least the liquid provided to the undersurface, the liquid extraction opening or the plurality of liquid extraction openings positioned, relative to the boundary, inwardly of the liquid supply opening or the plurality of liquid supply openings.

11. A lithographic apparatus comprising the fluid handling structure of claim 6, a substrate table configured to hold a substrate, and a projection system configured to project a beam having a pattern onto a target portion of the substrate, wherein the facing surface is a surface of the substrate and/or the substrate table.

12. A lithographic projection apparatus comprising:
    a substrate table configured to hold a substrate;
    a projection system configured to project a beam having a pattern onto a target portion of the substrate; and
    a fluid handling structure successively having, at a boundary from a space configured to contain immersion fluid to a region external to the fluid handling structure:
        a meniscus pinning feature to pin a meniscus which extends between the fluid handling structure and a facing surface which faces the fluid handling structure, and
        a liquid supply opening or a plurality of liquid supply openings outwardly, relative to the boundary, of the meniscus to provide liquid to an undersurface of the fluid handling structure, wherein, in use, the liquid provided on the undersurface is spaced apart by a gas gap from the facing surface.

13. The lithographic projection apparatus of claim 12, wherein a meniscus of the liquid provided on the undersurface is separate from a meniscus of liquid in the space.

14. The lithographic projection apparatus of claim 12, further comprising a further liquid supply opening or a plurality of further liquid supply openings to supply liquid inwardly, relative to the boundary, of the liquid supply opening or the plurality of liquid supply openings.

15. A device manufacturing method, comprising:
    confining a fluid to a space between a projection system and a surface facing the projection system using a fluid handling structure;
    maintaining a meniscus of the fluid which meniscus extends between the fluid handling structure and the surface;
    providing liquid to an undersurface of the fluid handling structure facing the surface through an outlet at a location, relative to the space, radially outward of the meniscus, wherein the liquid provided on the undersurface is spaced apart by a gas gap from the surface; and
    projecting a beam of radiation through the fluid in the space onto a substrate.

16. The method of claim 15, wherein a meniscus of the liquid provided on the undersurface is separate from a meniscus of liquid in the space.

17. The method of claim 15, comprising supplying further liquid inwardly, relative to the space, of the liquid provided to the undersurface.

18. A device manufacturing method, comprising:
    confining a fluid to a space between a projection system and a surface facing the projection system using a fluid handling structure;
    maintaining, using a meniscus pinning feature of the fluid handling structure, a meniscus of the fluid which meniscus extends between the fluid handling structure and the surface;
    providing liquid to an undersurface of the fluid handling structure facing the surface at a location, relative to the space, radially outward of the meniscus pinning feature, wherein the liquid provided on the undersurface is spaced apart by a gas gap from the surface, and wherein the gas gap is smaller than a gap between the meniscus pinning feature and the surface and the liquid provided on the undersurface is nearer to the facing surface than any part of the fluid handing structure outwardly of the meniscus pinning feature; and
    projecting a beam of radiation through the fluid in the space onto a substrate.

19. The method of claim 18, wherein a meniscus of the liquid provided on the undersurface is separate from a meniscus of liquid in the space.

20. The method of claim 18, comprising supplying further liquid inwardly, relative to the space, of the liquid provided to the undersurface.

* * * * *